(12) United States Patent
Wu et al.

(10) Patent No.: US 11,215,283 B2
(45) Date of Patent: Jan. 4, 2022

(54) DIAMOND-LIKE COATING FOR PISTON RING SURFACES, PISTON RING AND PROCESSES FOR PREPARING THE SAME

(71) Applicant: ASIMCO Shuanghuan Piston Ring(YiZheng) Co., Ltd., Yizheng Jiangsu (CN)

(72) Inventors: Yingxue Wu, Yizheng Jiangsu (CN); Qianxi Liu, Yizheng Jiangsu (CN); Yueting Zhou, Yizheng Jiangsu (CN); Bo Zhang, Yizheng Jiangsu (CN)

(73) Assignee: ASIMCO Shuanghuan Piston Ring(YIZheng) Co., Ltd.

( * ) Notice: Subject to any disclaimer, the term of this patent is extended or adjusted under 35 U.S.C. 154(b) by 83 days.

(21) Appl. No.: 15/296,310

(22) Filed: Oct. 18, 2016

(65) Prior Publication Data
US 2017/0261103 A1     Sep. 14, 2017

(30) Foreign Application Priority Data
Mar. 8, 2016  (CN) .......................... 201610131810.X

(51) Int. Cl.
*F16J 9/26*     (2006.01)
*C23C 14/06*    (2006.01)
(Continued)

(52) U.S. Cl.
CPC ................. *F16J 9/26* (2013.01); *C23C 14/06* (2013.01); *C23C 14/0605* (2013.01);
(Continued)

(58) Field of Classification Search
CPC ... C23C 28/046; C23C 28/044; C23C 14/024; C23C 28/048; C23C 16/029;
(Continued)

(56) References Cited

U.S. PATENT DOCUMENTS 5,988,103 A    11/1999  Fetherston et al.
6,740,393 B1 *  5/2004  Massler ................ C23C 16/029
                                                           428/216
(Continued)

FOREIGN PATENT DOCUMENTS

CN    102994967 A    3/2013
CN    103016200 A    4/2013
(Continued)

OTHER PUBLICATIONS

Translation DE 4343354; Kohlhof Karl Dr; Jun. 1995 (Year: 1995).*
Extended European Search Report for Application 16195507.5, dated May 29, 2017, 8 pgs., European Patent Office, Germany.

*Primary Examiner* — Humera N. Sheikh
*Assistant Examiner* — Elizabeth D Ivey
(74) *Attorney, Agent, or Firm* — McDonald Hopkins LLC

(57) ABSTRACT

The present invention relates to a diamond-like coating for piston ring surfaces, comprising, an underlayer, a gradient layer and an AM layer, wherein the AM layer is a diamond-like coating doped with doping elements. The doping elements are one or a combination of at least two selected from the group consisting of Cr, Si and Ti, and the content thereof shows a cyclical change in a form of a sine wave fluctuation along with the thickness change of the AM layer. As compared with the conventional single-layer structure or gradient layer structure, the AM layer of such diamond-like coating has a multi-cycle transition structure since the content of the doping elements in the AM layer of such diamond-like coating shows a cyclical change in a sine wave fluctuation form. On the basis of having high wear-resistant and low friction coefficient, it is beneficial to decrease the internal stress of the coating, increase the tenacity of the coating, ensure the increase of the thickness of diamond-like (Continued)

coating, and improve the durability of piston ring of diamond-like coating at the same time.

16 Claims, 3 Drawing Sheets

(51) Int. Cl.
    *C23C 16/30*     (2006.01)
    *C23C 16/455*     (2006.01)
    *C23C 16/515*     (2006.01)
    *C23C 28/00*     (2006.01)
    *C23C 14/16*     (2006.01)
    *C23C 14/34*     (2006.01)
    *C23C 16/26*     (2006.01)
    *C23C 16/50*     (2006.01)

(52) U.S. Cl.
    CPC .......... *C23C 14/165* (2013.01); *C23C 14/34* (2013.01); *C23C 16/26* (2013.01); *C23C 16/30* (2013.01); *C23C 16/45517* (2013.01); *C23C 16/50* (2013.01); *C23C 16/515* (2013.01); *C23C 28/32* (2013.01); *C23C 28/341* (2013.01); *C23C 28/343* (2013.01); *C23C 28/36* (2013.01)

(58) Field of Classification Search
    CPC . C23C 28/343; C23C 16/0272; C23C 14/027; C23C 14/0611; C23C 28/34; C23C 28/42; C23C 16/50; C23C 28/341; C23C 28/36; C23C 14/0635
    See application file for complete search history.

(56) References Cited

U.S. PATENT DOCUMENTS

| | | | |
|---|---|---|---|
| 7,160,616 B2* | 1/2007 | Massler | C23C 28/42 428/408 |
| 2011/0305922 A1* | 12/2011 | Noll | C22C 9/00 428/668 |
| 2013/0075977 A1* | 3/2013 | An | F16J 9/26 277/434 |

FOREIGN PATENT DOCUMENTS

| | | | | |
|---|---|---|---|---|
| DE | 4343354 A1 * | 6/1995 | ......... | C23C 14/0641 |
| DE | 102012007796 A1 | 10/2013 | | |
| EP | 0651069 A1 | 5/1995 | | |
| JP | 1989209707 A | 3/1991 | | |
| JP | 1994330288 A | 4/1996 | | |
| JP | 2003289152 A | 10/2003 | | |
| JP | 2015086967 A | 5/2015 | | |

* cited by examiner

DIAMOND-LIKE COATING FOR PISTON RING SURFACES, PISTON RING AND PROCESSES FOR PREPARING THE SAME

TECHNICAL FIELD

The present invention relates to the technical field of surface treatment of piston rings, specifically a diamond-like coating for piston ring surfaces, a piston ring and processes for preparing the same.

BACKGROUND RAT

A piston ring is one of the key parts of internal-combustion engine, and the abrasion thereof has a very important effect on overall fuel consumption of the engine. At present, vehicle engines (especially diesel engines) are developed in the direction of high mechanical loads, high output power (high heat load), low fuel consumption and low exhaust emission. Therefore, the piston ring tends to be thinner and lighter, which requires that the piston ring should have a very high strength (e.g., thermal fatigue strength), wear resistance, scuffing resistance, and sliding property which will not bring too much abrasion to the cylinder jacket.

In order to increase the efficiency and lifetime of the piston system, wear-resistant coatings with high hardness are widely used. Although hard coatings can greatly improve the wear-resistant lifetime of the friction pair of the cylinder jacket and piston ring, they have little effect on the friction coefficient during their relative motions.

One of the current effective solutions is to deposit a non-crystalline carbon coating having low friction and low wear characteristics, such as, for example, DLC (diamond-like carbon) coating, also called diamond-like coating.

Diamond-like coating shows wide application prospects in mechanical, electronic and biomedical science fields due to its high hardness, ultra-low friction coefficient, high wear resistance and corrosion resistance. However, the domestic well-known diamond-like coating has a smaller thickness, generally smaller than 5 μm, not exceeding 10 μm. Although such thinner diamond-like coating shows excellent low friction properties, such diamond-like coating cannot achieve the permanent function realization of engines to the piston ring surfaces under heavy pressure conditions because of insufficient durability.

At present, the bottleneck for promoting the application of the diamond-like coating mainly lies in that the diamond-like coatings prepared according to the current methods have higher internal stress. The greater the thickness of the coating, the larger the stress performance. When the thickness goes beyond 10 μm, peeling of the coating easily happens due to the high internal stress of the coating itself, so as to restrict the coating to have a greater thickness. In order to further extend the ability of diamond-like coating as functional protective coating, it is important to develop a suitable ultra-thick diamond-like coating.

SUMMARY

The first object can include providing a diamond-like coating for piston ring surfaces having a low internal stress and a great thickness.

The second object can include providing a piston ring comprising a diamond-like coating having a low internal stress and a great thickness on the surfaces thereof.

The third object can include providing a process for preparing a diamond-like coating for piston ring surfaces that is easy to operate and suitable for industrial production, wherein the resultant diamond-like coating has a low internal stress and a great thickness.

The diamond-like coating for piston ring surfaces comprises an underlayer, a gradient layer and an AM (amplitude-modulation) layer, wherein the AM layer is a diamond-like coating doped with doping elements. The doping elements are one or a combination of at least two selected from the group consisting of Cr, Si and Ti, and the content thereof shows a cyclical change in a form of a sine wave fluctuation along with the thickness change of the AM layer.

The doping elements corresponding to the valley of the sine wave may have a content of 3.0-5.0 at % in the AM layer; the doping elements corresponding to the peak of the sine wave may have a content of 9.0-11.0 at % in the AM layer.

The doping elements corresponding to the valley of the sine wave may have a content of 4.0 at % (percentage content of atomic numbers) in the AM layer; the doping elements corresponding to the peak of the sine wave may have a content of 10.0 at % in the AM layer.

The sine wave may have a fluctuation period of 20-50, e.g. 25-45, 30-40 or 35.

The AM layer corresponding to each fluctuation period of the sine wave may have a thickness of 0.5-0.8 μm.

The AM layer may have a crystalline distribution of submicrocrystalline.

The submicrocrystalline may have a particle size of 0.2-0.5 μm.

The underlayer may be one or a combination of at least two selected from the group consisting of Cr layer, Si layer and Ti layer. That is to say, the underlayer may be a single layer or a composite layer.

The gradient layer may be one or a combination of at least two selected from the group consisting of $Cr_xC$ layer, $Si_xC$ layer and $Ti_xC$ layer (or combination thereof), wherein x=0.5-1.5.

The diamond-like coating may have a thickness of 10-30 μm, e.g. 13-26 μm, 15-25 μm or 20 μm.

The underlayer may have a thickness of 0.2-1 μm, e.g. specifically 0.3 μm, 0.4 μm, 0.5 μm, 0.6 μm, 0.7 μm, 0.8 μm or 0.9 μm.

The gradient layer may have a thickness of 0.5-2 μm, e.g. specifically 0.6 μm, 0.7 μm, 0.8 μm, 0.9 μm, 1.0 μm, 1.1 μm, 1.2 μm, 1.3 μm, 1.4 μm, 1.5 μm, 1.6 μm, 1.7 μm, 1.8 μm or 1.9 μm.

The AM layer may have a thickness of 9.3-27 μm, e.g. 10-25 μm, or 15-20 μm.

The piston ring may have the aforesaid diamond-like coating on the surfaces thereof.

The process for preparing a diamond-like coating for piston ring surfaces is carried out in a PECVD device, where the piston ring to be plated is placed in a semi-closed device situated in a vacuum chamber of the PECVD device, comprising the following steps:

(1) forming an underlayer on the surface of the piston ring to be plated;

(2) forming a gradient layer on the underlayer; and (3) opening a DC pulse power supply, respectively applying a negative bias on the semi-closed device and the piston ring to be plated, feeding Ar, silicon source, with or without $C_2H_2$, wherein the silicon source flow shows a cyclical change in a form of a sine wave fluctuation, and finally forming an AM layer on the gradient layer.

In step (3), the silicon source corresponding to the sine wave valley of the silicon source flow may have a flow of 20-50 sccm (standard cubic centimeter per minute); the silicon source corresponding to the sine wave peak of the silicon source flow may have a flow of 90-160 sccm, wherein the silicon source corresponding to the sine wave valley of the silicon source flow may have a flow of specifically 21 sccm, 25 sccm, 30 sccm, 34 sccm, 35 sccm, 40 sccm, 42 sccm, 45 sccm or 48 sccm; the silicon source corresponding to the sine wave peak of the silicon source flow may have a flow of specifically 95 sccm, 100 sccm, 105 sccm, 110 sccm, 115 sccm, 120 sccm, 125 sccm, 130 sccm, 135 sccm, 140 sccm, 145 sccm, 150 sccm or 155 sccm.

The sine wave of the silicon source flow may have a fluctuation period of 20-50, e.g. 25-45, 30-40 or 35.

Each fluctuation period of the sine wave of the silicon source flow may go through 5-30 min, e.g. 8-26 min, 10-25 min, 13-22 min, 15-20 min or 18 min.

The silicon source may have $SiH_4$ and/or TMS (tetramethylsilane).

The process for preparing a diamond-like coating for piston ring surfaces can be carried out in a PECVD device, wherein the piston ring to be plated is placed in a semi-closed device situated in a vacuum chamber of the PECVD device, comprising the following steps:

(1) forming an underlayer on the surface of the piston ring to be plated;

(2) forming a gradient layer on the underlayer; and (3) opening a DC pulse power supply, respectively applying a negative bias on the semi-closed device and the piston ring to be plated, feeding Ar and $C_2H_2$, opening Cr target or Ti target, controlling the cathode current of Cr target or Ti target to show a cyclical change in a form of a sine wave fluctuation, and finally forming an AM layer on the gradient layer.

In step (3), the cathode current corresponding to the sine wave valley of the cathode current can be 50-60 A; the cathode current corresponding to the sine wave peak of the cathode current can be 100-125 A; wherein the cathode current corresponding to the sine wave valley of the cathode current may be specifically 51 A, 52 A, 53 A, 54 A, 55 A, 56 A, 57 A, 58 A or 59 A; the cathode current corresponding to the sine wave peak of the cathode current may be specifically 101 A, 102 A, 103 A, 104 A, 105 A, 106 A, 107 A, 108 A, 109 A, 110 A, 111 A, 112 A, 113 A, 114 A, 115 A, 116 A, 117 A, 118 A, 119 A, 120 A, 121 A, 122 A, 123 A or 124 A.

The sine wave of the cathode current may have a fluctuation period of 20-50, e.g. 25-45, 30-40 or 35.

Each fluctuation period of the sine wave of the cathode current may go through 5-30 min, e.g. 8-26 min, 10-25 min, 13-22 min, 15-20 min or 18 min.

In step (1), the underlayer is one or a combination of at least two selected from the group consisting of a Cr layer, Ti layer and Si layer.

The Cr layer or Ti layer is prepared respectively by sputtering Cr or Ti with the auxiliary cathode.

The Cr layer or Ti layer is prepared by feeding Ar having a flow of 350-650 sccm, opening Cr target or Ti target, controlling the cathode current of the Cr target or Ti target to be 110-135 A, sputtering with the auxiliary cathode and depositing the Cr layer or Ti layer on the piston ring surfaces to be plated.

Ar flow may be specifically 380 sccm, 400 sccm, 420 sccm, 450 sccm, 460 sccm, 500 sccm, 420 sccm, 550 sccm, 570 sccm, 600 sccm, 620 sccm or 630 sccm. The cathode current may be specifically 115 A, 120 A, 122 A, 125 A, 128 A, 130 A or 132 A.

The Si layer is prepared by using ionic state produced by decomposing $SiH_4$.

The Si layer is prepared by feeding Ar having a flow of 150-200 sccm and $SiH_4$ having a flow 50-70 sccm, discharging with high energy plasma on the piston ring surfaces to be plated to form the Si layer, wherein the reaction time ranges from 25 min to 75 min.

Ar flow may be specifically 152 sccm, 155 sccm, 160 sccm, 163 sccm, 165 sccm, 170 sccm, 175 sccm, 183 sccm, 185 sccm, 190 sccm, 195 sccm or 198 sccm; $SiH_4$ flow may be specifically 51 sccm, 52 sccm, 53 sccm, 54 sccm, 55 sccm, 56 sccm, 57 sccm, 58 sccm, 59 sccm, 60 sccm, 61 sccm, 62 sccm, 63 sccm, 64 sccm, 65 sccm, 66 sccm, 67 sccm, 68 sccm or 69 sccm.

In step (2), the gradient layer is one or a combination of at least two selected from the group consisting of a $Cr_xC$ layer, $Ti_xC$ layer and $Si_xC$ layer, wherein x=0.5-1.5.

The $Cr_xC$ layer or $Ti_xC$ layer is prepared by sputtering with the auxiliary cathode Cr target or Ti target and process reaction gas $C_2H_2$ and Ar.

The cathode current of the Cr target or Ti target is 100-125 A. The cathode current may be specifically 105 A, 106 A, 110 A, 112 A, 115 A, 120 A or 123 A.

When preparing the $Cr_xC$ layer or $Ti_xC$ layer, $C_2H_2$ flow is 70-100 sccm; $C_2H_2$ flow may be specifically 73 sccm, 75 sccm, 78 sccm, 80 sccm, 82 sccm, 85 sccm, 87 sccm, 90 sccm, 93 sccm, 95 sccm or 97 sccm.

When preparing the $Cr_xC$ layer or $Ti_xC$ layer, Ar flow is 150-200 sccm. Ar flow may be specifically 152 sccm, 155 sccm, 160 sccm, 163 sccm, 165 sccm, 170 sccm, 175 sccm, 183 sccm, 185 sccm, 190 sccm, 195 sccm or 198 sccm.

The $Si_xC$ layer is prepared by discharging mixed plasma of $SiH_4$, $C_2H_2$ and Ar.

The $SiH_4$ flow is controllably and gradually increased from 0 to 60 sccm.

When preparing the $Si_xC$ layer, $C_2H_2$ flow is 80-120 sccm. $C_2H_2$ flow may be specifically 83 sccm, 85 sccm, 88 sccm, 90 sccm, 92 sccm, 95 sccm, 97 sccm, 100 sccm, 103 sccm, 105 sccm, 108 sccm, 110 sccm, 112 sccm, 115 sccm or 117 sccm.

When preparing the $Si_xC$ layer, Ar flow is 150-200 sccm. Ar flow may be specifically 152 sccm, 155 sccm, 160 sccm, 163 sccm, 165 sccm, 170 sccm, 175 sccm, 183 sccm, 185 sccm, 190 sccm, 195 sccm or 198 sccm.

In step (3), the negative bias applied on the semi-closed device ranges from −1200V to −1800V; the difference between the negative bias applied on the piston ring to be plated and that applied on the semi-closed device ranges from −200 to 500V. That is, the negative bias applied on the piston ring to be plated is the second negative bias, and the negative bias applied on the semi-closed device is the first negative bias; the second negative bias minus the first negative bias is −200 to 500V.

In step (3), Ar flow is 150-200 sccm; $C_2H_2$ flow is 80-120 sccm. Ar flow may be specifically 152 sccm, 155 sccm, 160 sccm, 163 sccm, 165 sccm, 170 sccm, 175 sccm, 183 sccm, 185 sccm, 190 sccm, 195 sccm or 198 sccm; $C_2H_2$ flow may be specifically 83 sccm, 85 sccm, 88 sccm, 90 sccm, 92 sccm, 95 sccm, 97 sccm, 100 sccm, 103 sccm, 105 sccm, 108 sccm, 110 sccm, 112 sccm, 115 sccm or 117 sccm.

There also comprises prior to step (1) step (1a) cleaning the surface of the piston ring to be plated.

The process of cleaning the surface of the piston ring to be plated comprises feeding Ar having a purity of 99.99% and having a flow of 50-100 sccm; applying a negative bias of −800 to −2000V on the semi-closed device, wherein the difference between the negative bias applied on the piston ring to be plated and that applied on the semi-closed device is −100 to −200V, i.e. the negative bias applied on the piston ring to be plated is the second negative bias, and the negative bias applied on the semi-closed device is the first negative bias; the second negative bias minus the first negative bias is from −100 to −200V, ion bombarding with Ar ion the surface of the piston ring to be plated for 15-40 min, to prepare a cleaned piston ring to be plated.

The semi-closed device can include a reaction device which is not completely closed. During the reaction, the device is placed in a vacuum chamber. The reactant gas may be fed into the device from the gap of the semi-closed device, so as to make the piston ring in the semi-closed device in an environment full of the reactant gas. The semi-closed device may be in a cylindrical or frame form as long as it is semi-closed.

The semi-closed device is advantageous to intensively discharge the reactant gas around the piston ring to be plated, so as to greatly increase the deposition rate of the coating.

During plating, the application of negative bias on the semi-closed device and piston ring respectively equals to applying additional negative bias on the piston ring, further making plasma rapidly deposit onto the surface of the piston ring to be plated so as to form a dense coating structure.

As compared to the prior art, the present invention has the following advantages. As compared to the conventional single layer structure or gradient layer structure, the AM layer of such diamond-like coating has a multi-cycle transition structure since the content of the doping element(s) in the AM layer of such diamond-like coating shows a cyclical change in a sine wave fluctuation form. This is advantageous to decrease the internal stress of the coating, increase the tenacity of the coating and ensure the increase of the thickness of such diamond-like coating.

As different from the conventional doped diamond-like film having constant Si content, such diamond-like coating has an AM layer having a change of multi-cycle doping content which fluctuates in a sine wave cycle, so as to avoid the effect resulted from the mutation of the coating ingredients. Moreover, the crystalline distribution of submicrocrystalline can be formed in each layer, so as to increase the resistance of crack growth inside the coating and to decrease the flaw size of the coating (coarse columnar crystals, large particles and the like) and effectively increase the coating hardness.

In addition, although the thickness of the diamond-like coating is increased, it assures that the diamond-like coating has a lower friction coefficient. Upon testing, the friction coefficient of the diamond-like coating will not exceed 0.12. On the basis of high wear resistance and low friction coefficient, such diamond-like coating is advantageous to decrease the internal stress, increase the tenacity of the coating, and ensure the increase of the thickness of the diamond-like coating and increase the durability of the piston ring of the diamond-like coating at the same time.

The process is simple, and the thickness of the coating is controllable. Super thick diamond-like coating can be deposited on various sample substrates in a large area and at ultra-high speed. The process is suitable for large-scale production.

EMBODIMENTS

The present invention is further described in detail by combining with the drawings and examples.

EXAMPLE 1

Figure 1:
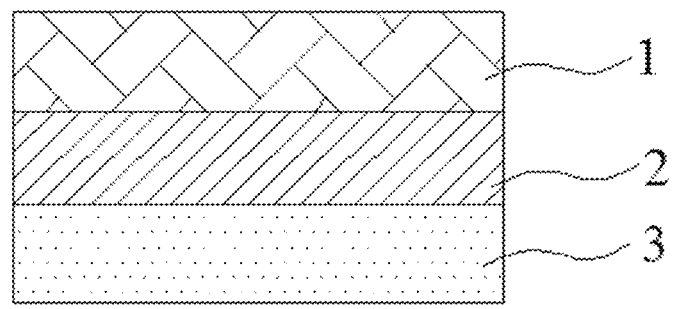
FIG. 1 shows a structural diagram of the diamond-like coating in Example 1.
Figure 6:
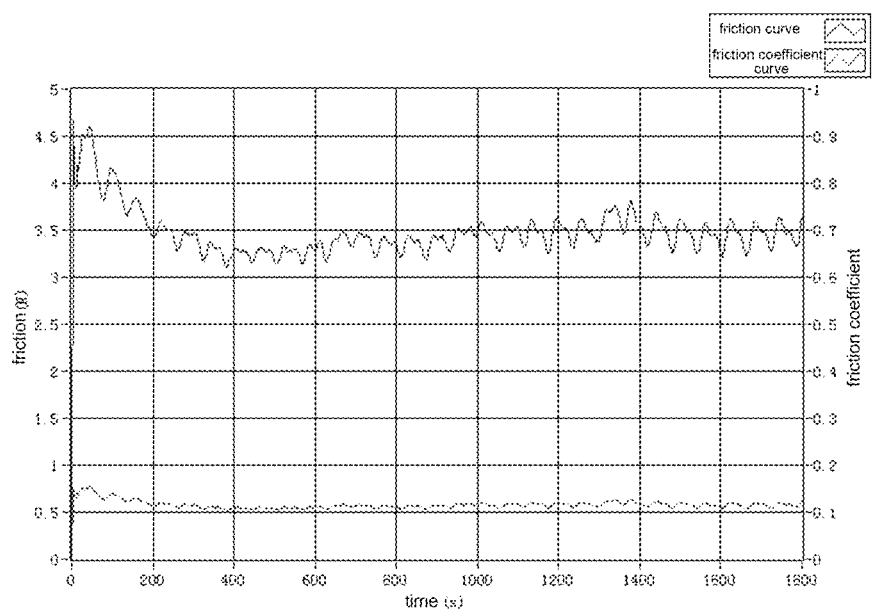
FIG. 6 shows a friction coefficient curve of the diamond-like coating prepared in Example 1 under dry friction condition.

This Example relates to a diamond-like coating for piston ring surfaces, as shown in FIG. 1, comprising, successively from the bottom to top, an underlayer 3—Si layer, a gradient layer 2—SiC layer and an AM layer 1—Si-DLC layer, i.e. Si-doped DLC layer (diamond-like coating). The Si layer has a thickness of 1 μm; the SiC layer has a thickness of 2 μm; and the Si-DLC layer has a total thickness of 27 μm. The diamond-like coating in this Example has a total thickness of 30 μm, and has a friction coefficient of 0.11 under dry friction conditions, as shown in FIG. 6.

Figure 2:
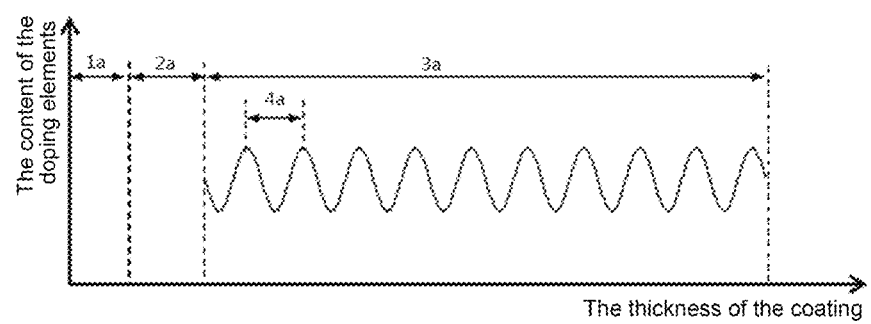
FIG. 2 shows a schematic diagram of the change of the doping element content in the AM layer of Example 1.

The content of Si in the AM layer 1 shows a cyclical change in a sine wave form along with the thickness of the AM layer 1, as shown in FIG. 2. In FIG. 2, 1a corresponds to the underlayer 3; 2a corresponds to the gradient layer 2; 3a corresponds to the AM layer 1 in FIG. 1; 4a is a change cycle of sine wave. In the AM layer 1, there are 45 cycle periods, i.e. the sine wave has a fluctuation period of 45. The thickness of the AM layer 1 corresponding to each fluctuation period is 0.6 μm. The content of Si corresponding to the wave valley of the sine wave is 4.0 at % in the AM layer 1; and the content of Si corresponding to the wave peak of the sine wave is 10.0 at % in the AM layer 1.

Figure 4:
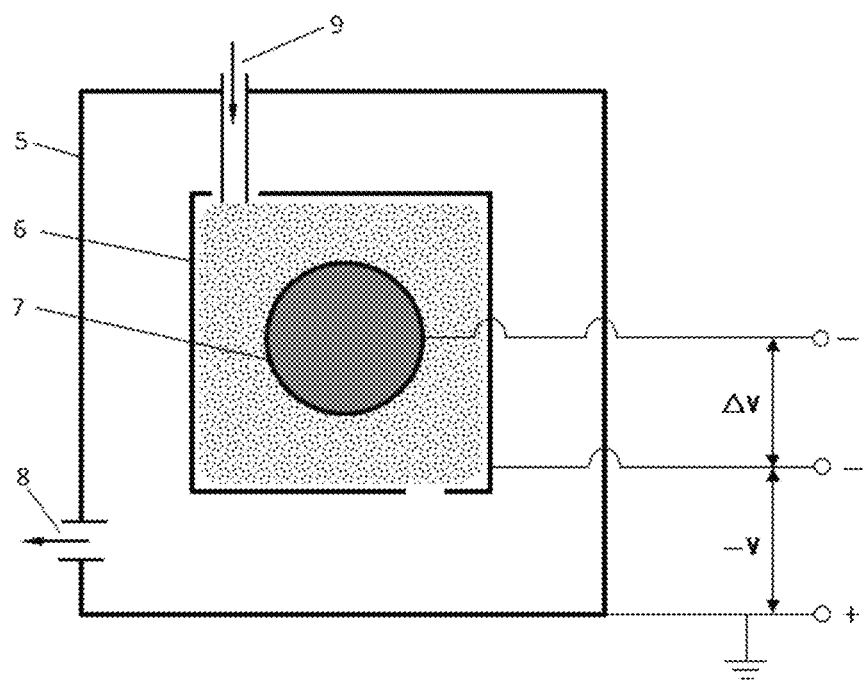
FIG. 4 shows a structural diagram of the device for preparing the diamond-like coating in Example 1.

When preparing the diamond-like coating of this example, the device used therein is a PECVD device. Specifically, the piston ring 7 to be plated was placed in a semi-closed device 6, and the semi-closed device 6 is placed in a vacuum chamber 5 of the PECVD device (see FIG. 4 for specific devices). Specifically, by exhausting with a vacuum pump 8, the process reaction gas was fed into the vacuum chamber 5 from the inlet port 9, and then into the semi-closed device 6. The process for preparing the diamond-like coating comprises the following steps:

(1a) cleaning the piston ring 7 to be plated: feeding 50 sccm of Ar having a purity of 99.99%, applying a first negative bias −1000V (i.e. −V in FIG. 4) to the semi-closed device 6, additionally applying a second negative bias to the piston ring 7, wherein the second negative bias minus the first negative bias is −200V (i.e. ΔV in FIG. 4, ΔV=the second negative bias minus the first negative bias); ion bombarding with Ar ion the surface of the piston ring 7 to be plated for 30 min, to prepare a cleaned piston ring 7 to be plated.

(1) preparing the underlayer 3: feeding Ar and $SiH_4$ respectively having a flow of 180 sccm and 60 sccm, forming the underlayer 3—Si layer by discharging with high energy plasma, lasting for 50 min, to prepare the underlayer 3.

(2) preparing the gradient layer 2: forming the gradient layer 2—SiC layer by discharging mixed $SiH_4$, $C_2H_2$, Ar with plasma, wherein $SiH_4$ flow is gradually increased from 0 to 60 sccm; $C_2H_2$ flow is 100 sccm; Ar flow is 180 sccm, to prepare the gradient layer 2.

Figure 3:
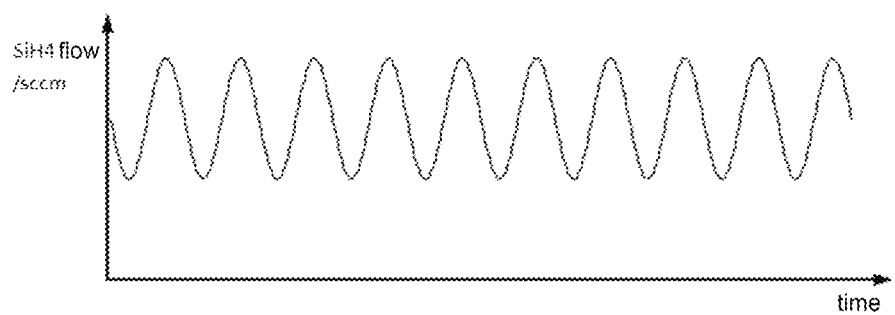
FIG. 3 shows a schematic diagram of the sine wave fluctuation of $SiH_4$ flow when preparing the AM layer in Example 1.

(3) preparing the AM layer 1: opening a DC pulse power supply, and finally depositing on the surface of piston ring 7 a Si-doped diamond-like coating having multi-cycle mutation structure by using the discharging reaction of plasma in the semi-closed device 6, wherein the cycle mutation employs gradual sine wave structure to reduce the structural mutation of the coating. The specific operations of this step comprise applying a first negative bias of −1200V (i.e. −V in FIG. 4) on the semi-closed device 6, applying a second negative bias on the piston ring 7 to be plated, wherein the second negative bias minus the first negative bias is −200V (i.e. ΔV in FIG. 4, ΔV=the second negative bias minus the first negative bias), feeding a mixed gas of Ar, $C_2H_2$ and $SiH_4$, wherein Ar flow is 180 sccm; $C_2H_2$ flow is 100 sccm. As shown in FIG. 3, $SiH_4$ flow shows a cyclical change in a sine wave fluctuation form. The silicon source flow corresponding to the sine wave valley is 20 sccm; the silicon source flow corresponding to the sine wave peak is 90 sccm; each fluctuation cycle of the sine wave lasts 25 min, the total circulation being 45 cycles.

Figure 5:
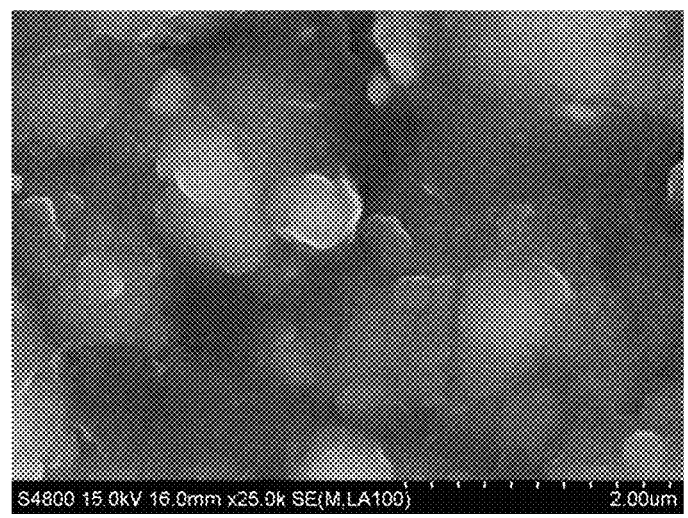
FIG. 5 shows a microscopic scanning electron micrograph of the diamond-like coating prepared in Example 1.

The microscopic scanning electron micrograph of the diamond-like coating prepared in this Example is shown in FIG. 5. According to FIG. 5, it can be seen that the diamond-like coating has a crystalline state of submicrocrystalline.

EXAMPLE 2

This Example relates to a diamond-like coating for piston ring surfaces, comprising, successively from the bottom to top, an underlayer—Si layer, a gradient layer—$Si_{0.8}C$ layer and an AM layer—Si-DLC layer. The Si layer has a thickness of 0.6 μm; the $Si_{0.8}C$ layer has a thickness of 1.2 μm; and the Si-DLC layer has a total thickness of 18 μm. The diamond-like coating in this Example has a total thickness of 19.8 μm, and has a friction coefficient of 0.11 under dry friction conditions.

The content of Si in the AM layer shows a cyclical change in a sine wave form along with the thickness of the AM layer. In the AM layer, there are 45 cycle periods, i.e. the sine wave has a fluctuation period of 45. The thickness of the AM layer corresponding to each fluctuation period is 0.4 μm. The content of Si corresponding to the wave valley of the sine wave is 4.0 at % in the AM layer; and the content of Si corresponding to the wave peak of the sine wave is 10.0 at % in the AM layer.

When preparing the diamond-like coating of this example, the device used therein is a PECVD device. Specifically, the piston ring to be plated was placed in a semi-closed device, and the semi-closed device is placed in a vacuum chamber of the PECVD device. The specific device is the same as that in Example 1. The process for preparing the diamond-like coating comprises the following steps:

(1a) cleaning the piston ring to be plated: the specific operations are the same as those in Step (1a) of Example 1.

(1) preparing the underlayer: feeding Ar and $SiH_4$ respectively having a flow of 180 sccm and 60 sccm, forming the underlayer—Si layer by discharging with high energy plasma, lasting for 30 min.

(2) preparing the gradient layer: forming the $Si_{0.8}C$ gradient layer by discharging mixed $SiH_4$, $C_2H_2$, Ar with plasma, wherein $SiH_4$ flow is gradually increased from 0 to 60 sccm; $C_2H_2$ flow is 120 sccm; Ar flow is 190 sccm.

(3) preparing the AM layer: opening a DC pulse power supply, and finally depositing on the surface of the piston ring a Si-doped diamond-like coating having a multi-cycle mutation structure by using the discharging reaction of plasma in the semi-closed device, wherein the cycle mutation employs gradual sine wave structure to reduce the structural mutation of the coating. The specific operations of this step comprise applying a first negative bias of −1200V on the semi-closed device, applying a second negative bias on the piston ring to be plated, wherein the second negative bias minus the first negative bias is −200V, feeding a mixed gas of Ar and TMS, wherein Ar flow is 180 sccm; TMS flow shows a cyclical change in a sine wave fluctuation form; the silicon source flow corresponding to the sine wave valley is 40 sccm; the silicon source flow corresponding to the sine wave peak is 120 sccm; each fluctuation cycle of the sine wave lasts 17 min, the total circulation being 45 cycles.

EXAMPLE 3

This Example relates to a diamond-like coating for piston ring surfaces, comprising, successively from the bottom to top, an underlayer—Cr layer, a gradient layer—CrC layer and an AM layer—Cr-DLC layer, i.e. Cr-doped DLC layer (diamond-like coating). The underlayer—Cr layer has a thickness of 1 μm; the CrC layer has a thickness of 2 μm; and the CrC-DLC AM layer has a total thickness of 27 μm. The diamond-like coating in this Example has a total thickness of 30 μm, and has a friction coefficient of 0.09 under dry friction conditions.

The content of Cr in the AM layer shows a cyclical change in a sine wave form along with the thickness of the AM layer. In the AM layer, there are 50 cycle periods, i.e. the sine wave has a fluctuation period of 50. The thickness of the AM layer corresponding to each fluctuation period is 0.54 μm. The content of Cr corresponding to the wave valley of the sine wave is 4.0 at % in the AM layer; and the content of Cr corresponding to the wave peak of the sine wave is 10.0 at % in the AM layer.

When preparing the diamond-like coating of this example, the device used therein is a PECVD device. Specifically, the piston ring to be plated was placed in a semi-closed device, and the semi-closed device is placed in a vacuum chamber of the PECVD device. The specific device is the same as that in Example 1. The process for preparing the diamond-like coating comprises the following steps:

(1a) cleaning the piston ring to be plated: the specific operations are the same as those in Step (1a) of Example 1.

(1) preparing the underlayer: feeding Ar having a flow of 350-650 sccm, opening Cr target, controlling the cathode current of Cr target to be 110 A, depositing the underlayer—Cr layer with the auxiliary cathode sputtering, lasting for 65 min.

(2) preparing the gradient layer: forming the CrC gradient layer by the auxiliary cathode sputtering Cr target and by using the processing reaction gas $C_2H_2$ and Ar, wherein Cr target has a cathode current of 125 A; $C_2H_2$ flow is 75 sccm; Ar flow is 180 sccm.

(3) preparing the AM layer: opening a DC pulse power supply, and finally depositing on the surface of the piston ring a Cr-doped diamond-like coating having a multi-cycle mutation structure by using a combination of plasma discharging reaction and magnetron sputtering, wherein the cycle mutation employs gradual sine wave structure to reduce the structural mutation of the coating. The specific operations of this step comprise applying a first negative bias of −1200V on the semi-closed device, applying a second negative bias on the piston ring to be plated, wherein the second negative bias minus the first negative bias is −200V, feeding a mixed gas of Ar and $C_2H_2$, wherein Ar flow is 160 sccm; $C_2H_2$ flow is 100 sccm; Cr target cathode current is controlled to show a cyclical change in a sine wave fluctuation form, the change tendency of cathode current, and $SiH_4$ flow change as shown in FIG. 3; the cathode current corresponding to the sine wave valley is 60 A; the cathode current corresponding to the sine wave peak is 125 A; each fluctuation cycle of the sine wave lasts for 28 min, the total circulation being 50 cycles.

EXAMPLE 4

This Example is different from Example 3 in that the underlayer is Ti layer; the ingredients and thicknesses of other layers are the same as those in Example 3.

The process for preparing the diamond-like coating in this Example is different from Example 3 in replacing Cr target in step (1) with Ti layer.

EXAMPLE 5

This Example is different from Example 3 in that the gradient layer is TiC layer; the ingredients and thicknesses of other layers are the same as those in Example 3.

The process for preparing the diamond-like coating in this Example is different from Example 3 in replacing Cr target in step (1) with Ti layer.

COMPARATIVE EXAMPLE

This Example relates to a diamond-like coating for piston ring surfaces, comprising, successively from the bottom to top, an underlayer—Si layer, a gradient layer—SiC layer and an Si-DLC layer, i.e. Si-doped diamond-like coating. The underlayer—Si layer has a thickness of 0.8 µm; the SiC layer has a thickness of 2 µm; and the Si-DLC layer has a thickness of 1.6 µm. The diamond-like coating in this Example has a total thickness of 4.4 µm, and has a friction coefficient of 0.10 under dry friction conditions.

In the Si-DLC layer of this Example, Si is added in a constant content which is 6 at %.

When preparing the diamond-like coating of this example, the device used therein is a PECVD device. This Example is different from Example 1 in directly placing the piston ring to be plated in a vacuum chamber. The process for preparing the diamond-like coating comprises the following steps:

(1a) cleaning the piston ring to be plated: the specific operations are the same as in those in Step (1a) of Example 1.

(1) preparing the underlayer: feeding Ar and $SiH_4$; Ar flow is 180 sccm; $SiH_4$ flow is 60 sccm; forming the Si underlayer by discharging high energy plasma, lasting for 45 min.

(2) preparing the gradient layer: discharging mixed plasma of $SiH_4$, $C_2H_2$ and Ar to form the SiC gradient layer, wherein $SiH_4$ flow is gradually increased from 0 to 60 sccm; $C_2H_2$ flow is 100 sccm; Ar flow is 180 sccm.

(3) preparing the Si-DLC layer: opening a DC pulse power supply, and finally depositing on the surface of the piston ring the diamond-like coating doped with Si by using the plasma discharging reaction. The piston ring to be plated is applied with a negative bias of −1000V; a mixed gas of Ar, $C_2H_2$ and $SiH_4$ is fed therein, wherein Ar flow is 180 sccm; $C_2H_2$ flow is 100 sccm; $SiH_4$ flow is 60 sccm; the deposition time is 140 min.

It can be seen by comparing Examples 1-3 with the Comparative Example that the thicknesses of the AM layers in Examples 1-3 are obviously greater than that in the Comparative Example since the content of the doping elements in the AM layers of Examples 1-3 has a cyclical change in a sine wave fluctuation form along with the thickness of the AM layer, so as to avoid the effect resulted from the mutation of the coating ingredients, to make a crystalline distribution of submicrocrystalline inside the AM layer corresponding to each cycle, and to decrease the internal stress of the diamond-like coating.

It can be seen by comparing the friction coefficients in Examples 1-3 and Comparative Example that, although the thicknesses in Examples 1-3 are obviously greater than that in the Comparative Example, it ensures that the diamond-like coating has a lower friction coefficient. That is, the increase of the thicknesses in Examples 1-3 will not affect the friction performance of the diamond-like coating.

The aforesaid specification and examples are only preferred embodiments of the present invention. As for those ordinarily skilled in the art, there can be changes in embodiments without changing the scope of the present invention. The contents in the description shall not be understood as a limit to the present invention.

The invention claimed is:

1. A coating for piston ring surfaces consisting of, successively from the bottom to top, an underlayer, a gradient layer and an AM layer, wherein the AM layer is a diamond-like coating doped with doping elements; the doping elements are one or a combination of at least two selected from the group consisting of Cr, Si and Ti, and the content thereof shows a cyclical change in a form of a sine wave fluctuation within the thickness of the AM layer based on the position within the thickness, wherein the doping elements corresponding to the valley of the sine wave are in a content of 9.0-11.0% in the AM layer, wherein the doping elements corresponding to the peak of the sine wave are in a content of 9.0-11.0% in the AM layer, wherein the sine wave for the AM layer has 20-50 fluctuation cycles, wherein each of the fluctuation cycles of the sine wave leads to a thickness of 0.5-0.8 µm for the AM layer and the AM layer has a thickness of 18-27 µm, wherein the AM layer has a crystalline distribution of submicrocrystalline particles, wherein the submicrocrystalline particles have a particle size of 0.2-0.5 µm, wherein the underlayer is one or a combination of at least two selected from the group consisting of Cr layer, Si layer and Ti layer, wherein the gradient layer is one or a combination of at least two selected from the group consisting of $Cr_xC$ layer, $Si_xC$ layer and $Ti_xC$ layer, wherein x=0.5-1.5, and wherein the coating for piston ring surfaces has a total thickness of 19.8-30 µm, the underlayer has a thickness of 0.2-1 µm; and the gradient layer has a thickness of 0.5-2 µm.

2. A piston ring coated by the coating for piston ring surfaces according to claim 1.

3. A process for preparing the coating for piston ring surfaces as claimed in claim 1, comprising: carrying out the process in a PECVD device, placing the piston ring to be plated in a semi-closed device situated in a vacuum chamber of the PECVD device, comprising the following steps:

(1) forming an underlayer on the surface of the piston ring to be plated;
(2) forming a gradient layer on the underlayer; and
(3) opening a DC pulse power supply, respectively applying a negative bias on the semi-closed device and the piston ring to be plated, feeding Ar, silicon source, with or without $C_2H_2$, wherein the silicon source flow shows a cyclical change in a form of a sine wave fluctuation, and finally forming an AM layer on the gradient layer.

4. The process as claimed in claim 3, wherein in step (3), the silicon source corresponding to the sine wave valley of the silicon source flow has a flow of 20-50 sccm; the silicon source corresponding to the sine wave peak of the silicon source flow has a flow of 90-160 sccm; the sine wave of the silicon source flow has a fluctuation period of 20-50; each fluctuation period of the sine wave of the silicon source flow goes through 5-30 min; and the silicon source is $SiH_4$ and/or TMS.

5. The process as claimed in claim 3, wherein the Cr layer or Ti layer is prepared by feeding Ar having a flow of 350-650 sccm, opening Cr target or Ti target, controlling the cathode current of Cr target or Ti target to be 110-135 A, sputtering with the auxiliary cathode and depositing Cr layer or Ti layer on the piston ring surfaces to be plated; and the Si layer is prepared by feeding Ar having a flow of 150-200 sccm and $SiH_4$ having a flow 50-70 sccm, discharging with high energy plasma on the piston ring surfaces to be plated to form Si layer, wherein the reaction time ranges from 25 min to 75 min.

6. The process as claimed in claim 3, wherein the $Cr_xC$ layer or $Ti_xC$ layer is prepared by sputtering with the auxiliary cathode Cr target or Ti target and process reaction gas $C_2H_2$ and Ar; the Cr target or Ti target has a cathode current of 100-125 A; $C_2H_2$ has a flow of 70-100 sccm when preparing $Cr_xC$ layer or $Ti_xC$ layer; and Ar has a flow of 150-200 sccm when preparing $Cr_xC$ layer or $Ti_xC$ layer.

7. The process as claimed in claim 3, wherein the $Si_xC$ layer is prepared by discharging mixed plasma of $SiH_4$, $C_2H_2$ and Ar; the $SiH_4$ flow is gradually and controllably increased from 0 to 60 sccm; $C_2H_2$ has a flow of 80-120 sccm when preparing the $Si_xC$ layer; and Ar has a flow of 150-200 sccm when preparing the $Si_xC$ layer.

8. The process as claimed in claim 3, wherein in step (3), the negative bias applied on the semi-closed device ranges from −1200 to −1800V; the difference between the negative bias applied on the piston ring to be plated and that applied on the semi-closed device ranges from −200 to 500V; in step (3), Ar has a flow of 150-200 sccm; $C_2H_2$ has a flow of 80-120 sccm.

9. The process as claimed in claim 3, wherein there also comprises prior to step (1) step (1a) cleaning the surface of the piston ring to be plated; the process of cleaning the surface of the piston ring to be plated comprises feeding Ar having a purity of 99.99% and having a flow of 50-100 sccm; applying a negative bias of −800 to −2000V on the semi-closed device, wherein the difference between the negative bias applied on the piston ring to be plated and that applied on the semi-closed device is −100 to −200V, ion bombarding with Ar ion the surface of the piston ring to be plated for 15-40 min, to prepare a cleaned piston ring to be plated.

10. A process for preparing the coating for piston ring surfaces as claimed in claim 1, characterized in carrying out the process in a PECVD device,
placing the piston ring to be plated in a semi-closed device situated in a vacuum chamber of the PECVD device, comprising the following steps:
(1) forming an underlayer on the surface of the piston ring to be plated;
(2) forming a gradient layer on the underlayer; and
(3) opening a DC pulse power supply, respectively applying a negative bias on the semi-closed device and the piston ring to be plated, feeding Ar and $C_2H_2$, opening Cr target or Ti target, controlling the cathode current of Cr target or Ti target to show a cyclical change in a form of a sine wave fluctuation, and finally forming an AM layer on the gradient layer.

11. The process as claimed in claim 10, wherein in step (3), the cathode current corresponding to the sine wave valley of the cathode current is 50-60 A; the cathode current corresponding to the sine wave peak of the cathode current is 100-125 A; the sine wave of the cathode current has a fluctuation period of 20-50; and each fluctuation period of the sine wave of the cathode current goes through 5-30 min.

12. The process as claimed in claim 10, wherein the Cr layer or Ti layer is prepared by feeding Ar having a flow of 350-650 sccm, opening Cr target or Ti target, controlling the cathode current of Cr target or Ti target to be 110-135 A, sputtering with the auxiliary cathode and depositing Cr layer or Ti layer on the piston ring surfaces to be plated; and the Si layer is prepared by feeding Ar having a flow of 150-200 sccm and SiH4 having a flow 50-70 sccm, discharging with high energy plasma on the piston ring surfaces to be plated to form Si layer, wherein the reaction time ranges from 25 min to 75 min.

13. The process as claimed in claim 10, wherein the $Si_xC$ layer is prepared by discharging mixed plasma of $SiH_4$, $C_2H_2$ and Ar; the $SiH_4$ flow is gradually and controllably increased from 0 to 60 sccm; $C_2H_2$ has a flow of 80-120 sccm when preparing the $Si_xC$ layer; and Ar has a flow of 150-200 sccm when preparing the $Si_xC$ layer.

14. The process as claimed in claim 13, wherein the $Si_xC$ layer is prepared by discharging mixed plasma of $SiH_4$, $C_2H_2$ and Ar; the $SiH_4$ flow is gradually and controllably increased from 0 to 60 sccm; $C_2H_2$ has a flow of 80-120 sccm when preparing the $Si_xC$ layer; and Ar has a flow of 150-200 sccm when preparing the $Si_xC$ layer.

15. The process as claimed in claim 10, wherein in step (3), the negative bias applied on the semi-closed device ranges from −1200 to −1800V; the difference between the negative bias applied on the piston ring to be plated and that applied on the semi-closed device ranges from −200 to 500V; in step (3), Ar has a flow of 150-200 sccm; and $C_2H_2$ has a flow of 80-120 sccm.

16. The process as claimed in claim 10, wherein there also comprises prior to step (1) step (1a) cleaning the surface of the piston ring to be plated; the process of cleaning the surface of the piston ring to be plated comprises feeding Ar having a purity of 99.99% and having a flow of 50-100 sccm; applying a negative bias of −800 to −2000V on the semi-closed device, wherein the difference between the negative bias applied on the piston ring to be plated and that applied on the semi-closed device is −100 to −200V, ion bombarding with Ar ion the surface of the piston ring to be plated for 15-40 min, to prepare a cleaned piston ring to be plated.

* * * * *